United States Patent
Sauter et al.

[11] 4,016,516
[45] Apr. 5, 1977

[54] REFLECTIVE SIGNAL CONTROLLER

[75] Inventors: Walter A. Sauter, Malibu; David R. Martin, Simi Valley, both of Calif.

[73] Assignee: American Nucleonics Corporation, Woodland Hills, Calif.

[22] Filed: Dec. 4, 1975

[21] Appl. No.: 637,600

Related U.S. Application Data

[63] Continuation-in-part of Ser. No. 473,427, May 28, 1974, abandoned.

[52] U.S. Cl. .................. 333/81 R; 307/262; 307/264; 333/7 D; 333/10; 333/81 A
[51] Int. Cl.² ............................... H01P 1/22
[58] Field of Search ........ 333/7 D, 10, 31 R, 31 A, 333/81 R, 81 A, 81 B; 307/237, 296, 317, 262, 264

[56] References Cited

UNITED STATES PATENTS

| | | | |
|---|---|---|---|
| 3,550,041 | 12/1970 | Sauter | 333/7 D |
| 3,559,108 | 1/1971 | Seidel | 333/7 D |
| 3,673,492 | 6/1972 | Gilson | 333/81 A X |
| 3,931,599 | 1/1976 | Salzberg | 333/31 R |

*Primary Examiner*—Paul L. Gensler
*Attorney, Agent, or Firm*—John E. Wagner

[57] ABSTRACT

Disclosed is a solid state signal controller designed to be inserted in a radio frequency transmission line or path between a source and a signal utilization device to allow the control by external means of signal amplitude ratio and polarity, with a minimum of distortion of the signal. This invention has a dynamic range of more than 100 db and is capable of greater power handling capacity than the prior art signal controllers. It employs a plurality of semiconductor diodes, commonly known as PIN diodes, each cooperating with an energy coupler and having their respective impedances controlled to effect a reflection of energy with either positive or negative polarity toward an output terminal.

In one embodiment employing a single channel, a pair of control elements are employed. In the second embodiment, four impedance elements are employed to produce a pair of quadrature signals, each independently controllable in amplitude and polarity.

5 Claims, 8 Drawing Figures

REFLECTIVE SIGNAL CONTROLLER

REFERENCE TO RELATED APPLICATIONS

This is a continuation-in-part of U.S. application, Ser. No. 473,427, filed May 28, 1974, now abandoned.

BACKGROUND OF THE INVENTION

The control of RF signals in a frequency range of up to 500 megahertz has been accomplished employing the previous invention of one of the inventors of this device and is disclosed in U.S. Pat. No. 3,550,041. The signal controllers disclosed in that patent were designed to accomplish the same general results as this invention and proved eminently satisfactory to provide isolation as great as 80 db with power levels up to −20dbm at frequencies up to 500 megahertz. That system involved a plurality of semiconductive devices such as PIN diodes arranged in series with the signal path with independent bias establishing means for controlling the bias and thus the transmission through the signal controller.

We have found that the effects of frequency on the PIN diode impedance and its thermal energy absorption limitations tend to limit the instantaneous bandwidth frequency response signal and power handling capability of this type of controller.

Other prior art known to the applicants are the U.S. Pat. No. 3,559,108 to H. Seidal showing use of PIN diodes in combination with hybrid couplers and switches with selectable bias supplies to switch PIN diodes into conducting, non-conducting condition; and U.S. Pat. No. 3,673,492 to R. A. Gilson showing the use of PIN diodes in combination with hybrid networks to attenuate energy as a function of a control voltage. The PIN diodes are connected in parallel with a terminating resistance.

The coupler switches of the U.S. Pat. No. 3,559,108 do not dissipate energy in the diodes but merely act as switches and reflect energy back into the input line when in an open state. This reflected energy can be re-reflected back into the diodes by discontinuities or impedance mismatch in the input line or the source, to distort and degrade any signals conducted through the switch. Switches of such type are unsatisfactory for high resolution signal controller applications when the energy that is not intentionally reflected to the output port is not dissipated.

The attenuator of U.S. Pat. No. 3,673,492 employs characteristic impedance terminating resistors which limit the maximum impedance seen at the quadrature terminals of a quadrature device. This prevents the impedance from ever exceeding that of the characteristic impedance resistors and no polarity reversing can be accomplished.

BRIEF DESCRIPTION OF THE INVENTION

We have therefore devised a signal controller likewise using semi-conductor devices such as PIN diodes in which the PIN diodes are matched in impedance to the transmission line at the normal or zero reflection relationship with a termination to ground whereby the diodes in the zero reflection mode do not reflect the energy received from the imput port directly or through a coupling device, therefore energy is not reflected onward to the output port. The fact that one electrode of each PIN diode is connected directly to ground provides a direct connection to a large thermal heat sink thereby allowing the signal controller to dissipate greater energy than heretofore. Also, because the device is in effect, a termination that dissipates undesired energy and transmits desired energy by reflection rather than by transmission, its internal characteristics do not directly limit the controller's instantaneous bandwidth and power capability. Each of the limitations in the prior art system are therefore overcome by this new invention.

In an alternate embodiment, a forward biased diode is connected in series with the output of the signal controller with the bias source. Interrupting the bias source opens the output and reflects incoming energy to be dissipated in the signal controller.

BRIEF DESCRIPTION OF THE INVENTION

This invention may be more clearly understood from the following detailed description and by reference to the drawings in which.

DETAILED DESCRIPTION OF THE INVENTION

Figure 1:
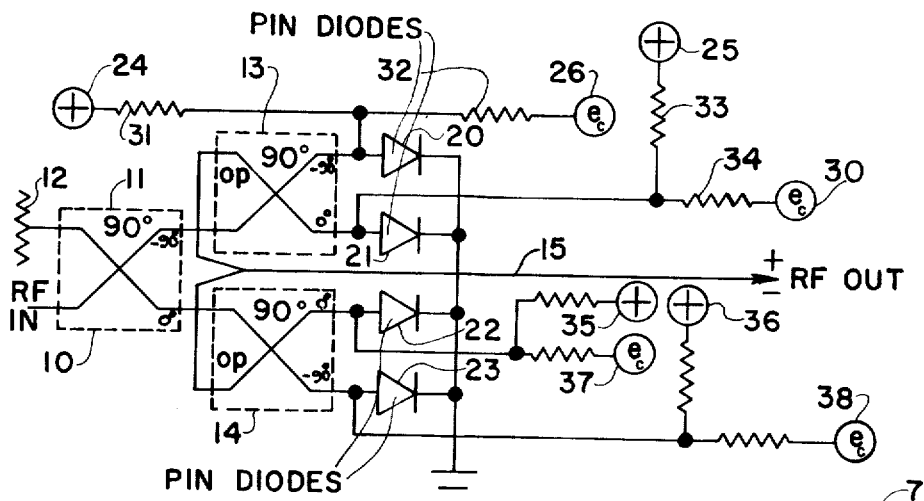
FIG. 1 is an electrical schematic representation of one embodiment of this invention.

This invention is shown in its basic form in FIG. 1 as applied to a system for controlling the output amplitude ratio of an RF signal appearing at input lead 10. The system includes a 90° hybrid coupler 11 with a matching termination 12 at one of its ports. The remaining two ports 0° and 90° are coupled respectively to two additional 90° hybrid couplers 13 and 14. These couplers 13 and 14 have a pair of output ports OP electrically connected together to a common lead 15 on which the controlled radio frequency output of the controller is extracted. The remaining two ports of the hybrids 13 and 14, 0° and 90° are each connected to the input of a respective semiconductor device 20 through 23, each of which has its cathode grounded. The semiconductor devices 20–23 are preferably PIN diodes.

The PIN diodes 20 and 21 each have a respective static DC bias supply 24 and 25 connected to the inputs of their respective diodes and a respective variable $e_c$ control voltage supply 26 and 30. The static and control voltage supplies each are connected to the inputs of the PIN diodes 20 and 21 via respective dropping resistors 31 and 32 associated with supplies 24 and 26, and 33 and 34 associated with supplies 25 and 30. The diodes 22 and 23 are similarly connected with composite power supplies similar to 24, 25, 26 and 30, namely fixed bias supplies 35 and 36 and variable bias supplies 37 and 38 respectively.

Figure 2:
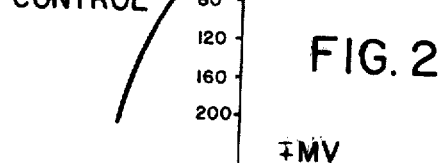
FIG. 2 is a graphical representation of the control characteristics of the device of FIG. 1.
Figure 4:
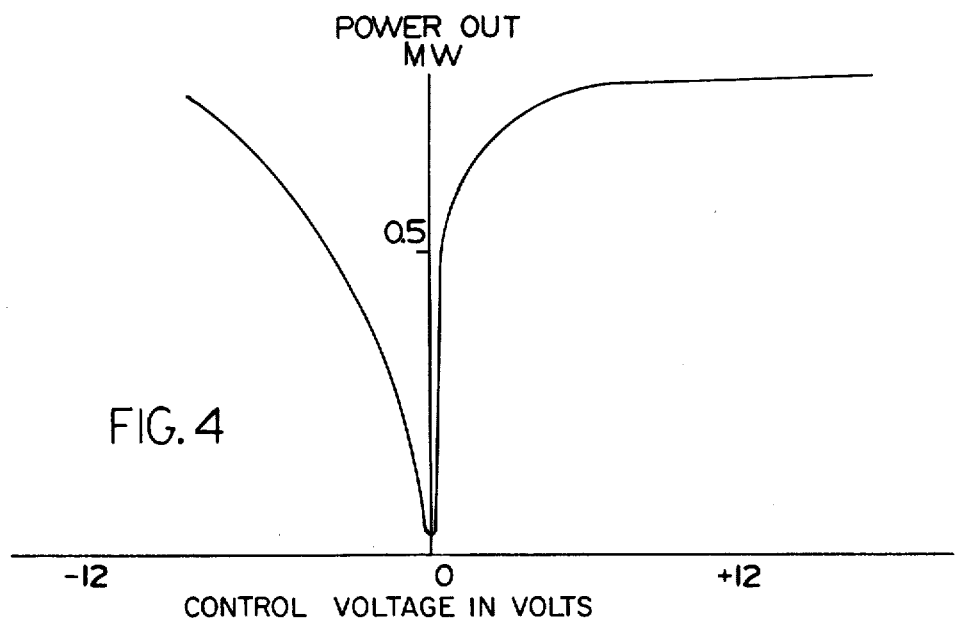
FIG. 4 is a graphical representation of the attenuation characteristics of this invention.

As illustrated in FIG. 2 representing the operating characteristics of this signal controller, the variable bias supplies may be varied continuously from a positive to a negative polarity. The effect of the control voltages $e_c$ supplied by sources 26 and 30 is illustrated in FIG. 2 which is a graphical representation of the RF output voltage in millivolts on the ordinate axis as a function of the control voltage represented on the abscissa in volts DC varying from negative to positive. It should be noted in FIG. 2 that the curve is somewhat asymmetrical but passes through the origin without transition and thereby provides a smooth control from negative to positive polarity RF signals under the control of the control voltage sources 26 and 30. Linearizing circuitry may be added to the control circuitry to provide a virtually linear curve in place of the curve of FIG. 2. However, the unmodified curve as produced by the circuitry of FIG. 1 is shown in FIG. 2. The effect of the control voltage ec without regard to the polarity of the output RF as compared with the input RF signal is graphically illustrated in FIG. 4. There it may be seen that with variation from approximately minus 12 volts DC to plus 12 volts DC, the RF output in milliwatts with the control voltage set at zero is virtually zero and on either side of the origin rises to the order of 0.5 milliwatts relatively linearly in either direction. The linear range from 0 to +—0.5 milliwatts is a typical operation range of devices in applications of this invention.

Figure 3:
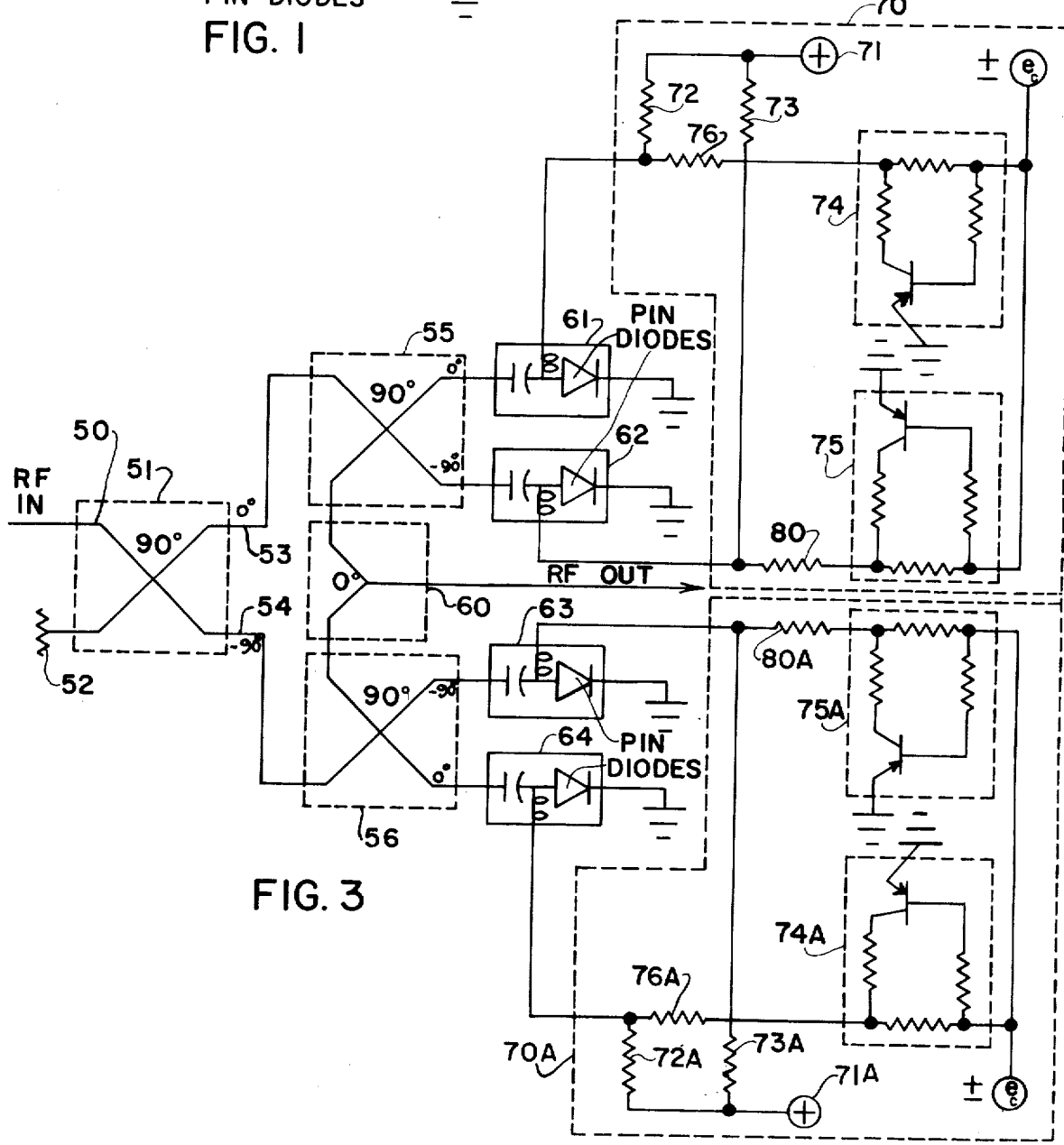
FIG. 3 is an electrical schematic representation of a second embodiment of this invention.

Now referring to Fig. 3, an alternate embodiment of this invention is shown therein with the RF input signal applied to lead 50 at the input of the 90° hydrid coupler 51 with a corresponding termination 52. The output ports 53 and 54 of the hybrid coupler 51 are coupled respectively to the inputs of an additional pair of 90° hybrid couplers 55 and 56. The hybrid couplers 55 and 56 have adjacent port connected to a 0° summer 60, a device which sums two signals without introducing any phase shift between input and output. The remaining two ports of the hydrid couplers 55 and 56 are connected by respective PIN diodes 61, 62, 63 and 64, each including an internal capacitance and inductance and each having their respective output grounded. The inputs of the PIN diodes 61 and 62 are controlled in a manner similar to the comparable inputs of the PIN diodes of Fig. 1 by a DC supply network 70 including the fixed DC supply 71 connected by dropping resistors 72 and 73 to the inputs of PIN diodes 61 and 62. Active control voltages are supplied from the source $e_c$ via transistor networks 74 and 75 as well as respective resistors 76 and 80. Therefore, similar to the embodiment of FIG. 1, a fixed bias and a variable bias is supplied to the input of each of the two control PIN diodes.

A similar control network is connected to the inputs of diodes 63 and 64 as is shown in the drawing in the interest of completeness. In this case, the controlled RF output is taken from the hybrid 60.

THEORY OF OPERATION

The static sources of the embodiment of FIG. 1, namely 24, 25, 35 and 36, as well as their counter parts in the embodiment of FIG. 3 provide zero bias condition. In Fig. 3 the static source includes a fixed DC voltage supply 71 applied to resistor 72 and resistor 73. The polarity of this source 71 is such that the PIN diode 61 connected to resistor 72 and the PIN diode 62 connected to resistor 73 will pass to ground essentially all of the current passed by their respective resistors when the active control voltage supplied at $e_c$ is zero. (See Fig. 2.) The resistance of resistors 72 and 73 is selected (when the control voltage is zero) so that the amount of current passed to ground through each PIN diode 61 and 62 causes it to have a resistance equal to the characteristic impedance of its hybrid coupler 55 producing the "$e_c$=0", "RFout=0" relationship.

When in this matched or "equal to" condition, all of the signal applied to PIN diodes 61 and 62 via the hybrid coupler 55 is dissipated. If the resistance of the specific PIN diodes used was adjusted to be less than the characteristic impedance of the hybrid coupler 55, some of the RF input signal would have been reflected to the output (normally isolated) port of the hybrid coupler 55 with the same relative polarity as the RF input signal. If the resistance of the specific PIN diodes used was adjusted to be greater than the characteristic impedance of the hybrid coupler, some of the RF input signal would have been reflected to the output (normally isolated) port of the hybrid coupler 55 with a relative polarity 180° out of phase with the RF input signal.

Figure 5:
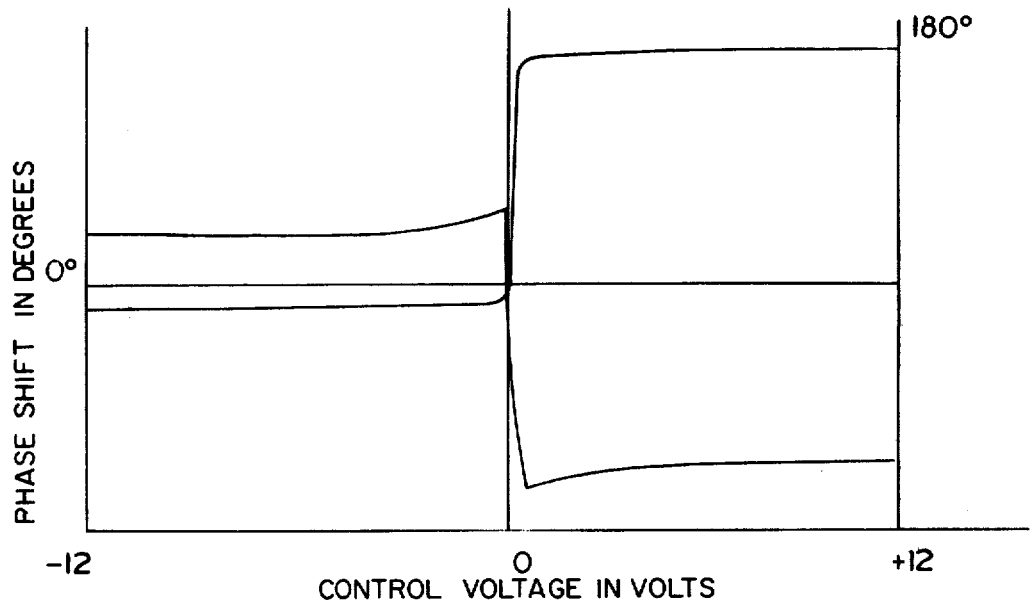
FIG. 5 is a graphical representation of the phase characteristics of this invention.

In summary, the purpose of the static source 71 is to supply bias current to each PIN diode 61 and 62 via its bias resistor (72 and 73) at a level that causes the reflected RF output signal to be zero when the control source voltage $e_c$ is zero. This same function is performed by the static source 71a in the D.C. supply network 70A of FIG. 3 and the static supplies 24, 25, 35 and 36 of Fig. 1

Where the signal controller of this invention is applied towards the simultaneous control of the sine and cosine derivatives, e.g., two independently controlled quarature components of the RF signal, the characteristic phase is illustrated in FIG. 5. This figure shows the phase characteristic of the sine signal controller with a virtual 180° phase shift as the control voltage passes through 0 and virtually flat phase characteristics throughout the remainder of the control range. This establishes the fact that the controller is virtually an amplitude ratio controller with wholly insignificant phase deviation throughout its normal rating range. Fundamentally, the signal controllers of both FIG. 1 and FIG. 3 operate by applying a controllable variable impedance mismatch to the second and third couplers, depending upon the level of the control voltage $e_c$. When the impedance of a PIN diode matches that of the line and its associated components, no energy is reflected to its associated coupler, and in turn coupled to the output line. When energy is reflected to the second and third couplers, the reflected energy is directed toward the output line. It may therefore be seen that in accordance with this invention, signals are attenuated by providing two matching terminations rather than by a series attenuation. This is responsible for a major feature of greater power capability. When the signal controller is required to absorb a major amount of energy, it does so by dissipating the applied RF energy in diodes which have one electrode grounded to a ground plane that also functions as a large heat sink. For maximum output, the energy is reflected by the PIN diode when it provides an open circuit or short circuit reflecting mismatch. Additionally, when the line is shorted by the diode to ground, the interelectrode capacitance of the diode is also shorted to ground and therefore does not affect response in the signal controller. For the open circuit condition, the interelectrode capacitance of the diode can be matched to that of the line. These features contribute to the improved frequency and power handling capability of this invention.

PIN diodes, type UM 7000, manufactured by the Unitrode Corporation of Watertown, Mass., are used with the 90° hybrid couplers.

Figure 6:
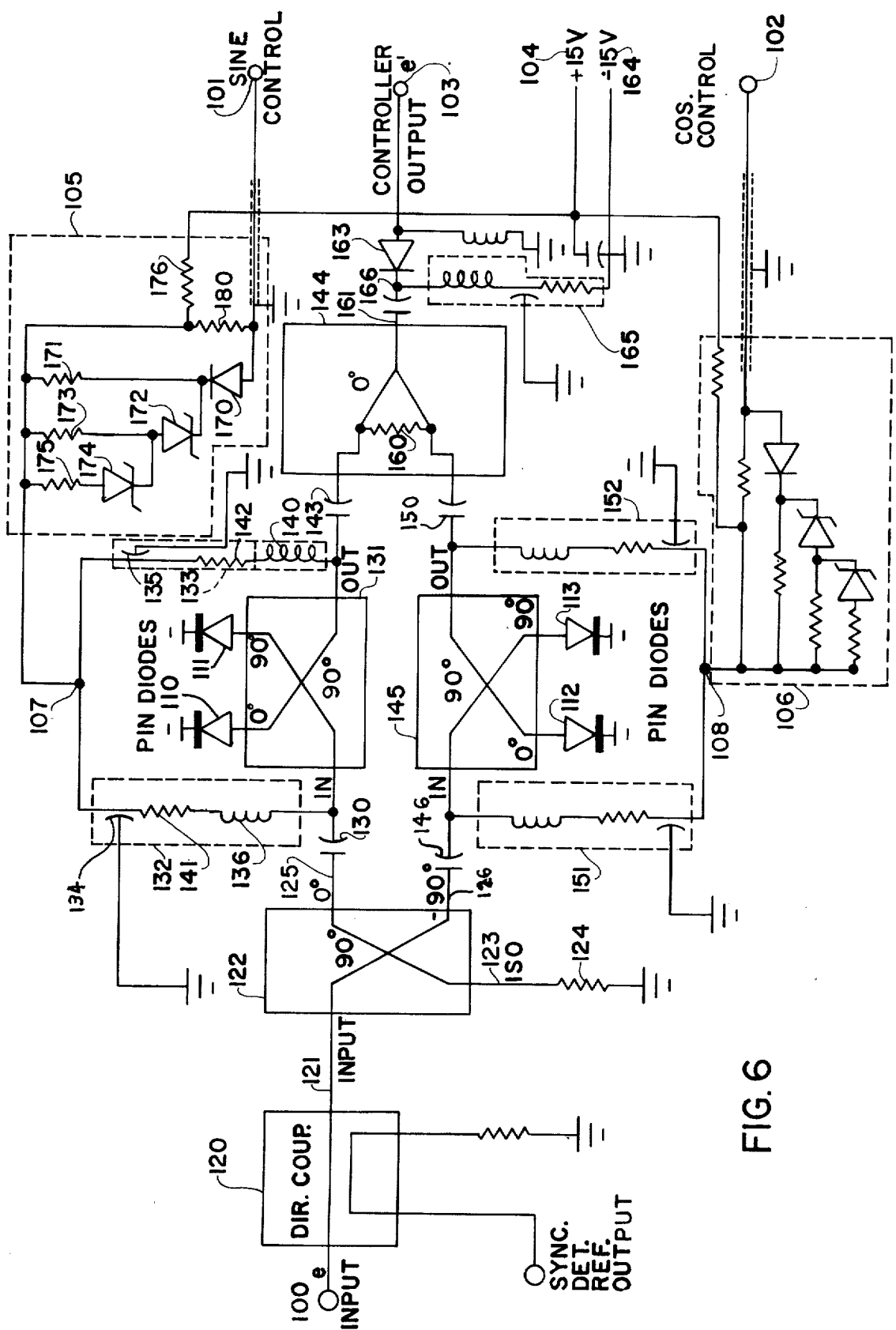
FIG. 6 is an electrical schematic diagram of a third embodiment of this invention.

Now referring to FIG. 6, an alternate embodiment of this invention is disclosed therein designed to control up to one watt of RF energy in the 225–400 megahertz frequency range introduced into the controller at input terminal 100. Input energy $e$ is subject to simultaneous sine and cosine control by the application of variable and polarity reversible dc control signals to their respective terminals 101 and 102. The output of the signal controller of FIG. 6 is taken at terminal 103. In addition to the variable bias controls 101 and 102, a common fixed bias 104 supplies a positive bias, for example 15 volts, to a pair of curve straightening or linearizing networks 105 and 106 to establish a predetermined bias level to a pair of referrence junctions 107 and 108.

The signal controller itself again uses two pair of semi-conductor controlling devices, in this case PIN diodes 110 and 111, 112 and 113, each with their cathodes connected to ground. The signal controller of FIG. 6 employs the basic principles disclosed in FIGS. 1 and 3, and additionally exhibits superior linearity of the output characteristics as demonstrated in FIG. 7. Additionally, the embodiment of FIG. 6 provides for positive interpretation of the operation of the signal controller under the control of a solid state switch 163 described below in greater detail.

Now, tracing the signal through the controller of FIG. 6, we see that an input RF signal $e$ is applied to the terminal 100 and introduced into a directional coupler 120. A reference and introduced into a directional coupler 120. A reference output for a synchronous detector may be derived without interference with the signal $e$ which then, on lead 121, enters a 90° quadrature coupler 122 at its input port so labeled. The coupler 122 includes an isolated port 123 connected to ground through a resistance element 124 and a pair of quadrature (output) ports 125 and 126, one labeled 0° port (125) and the second 90° port (126). These ports 125 and 126, in accordance with well established quadrature hydrid theory, each convey the input signal with a 90° phase difference between the signals at ports 125 and 126. The output of port 125 is conducted via DC blocking capacitor 130 to a 90° quadrature coupler 131 at its input port. The two quadrature ports labeled 0° and 90° of hybrid 131 are each connected to respective PIN diodes 110 and 111, which as indicated above, have their cathodes grounded. The fourth or output port of the hybrid coupler 131 conveys to the 0° summing hybrid 144, the sine input signal modified as a function of the level control signal applied to the sine control terminal 101. This may be represented as $e' = f_c \sin(e)$ where $e$ represents the input signal at terminal 100, $f \sin c$. represents the function of the magnitude and polarity of the sine control voltage applied to terminal 101 and $e'$ represents the sine output component of the controller at terminal 103.

The combined dc bias from fixed supply 104 and the variable bias or sine control from terminal 101 applied through the linerization network 105 to junction 107, is applied simultaneously to the anodes of both diode 110 and 111 via respective low pass filters 132 and 133, which isolate the RF signal path from the dc control path. Each of these filters 132 and 133 include shunt capacitors to ground 134 and 135 respectively, as well as RF blocking inductors 136 and 140, and resistances 141 and 142.

The output of the coupler 131 is introduced by a coupling capacitor 143 to a summing network or 0° hybrid 144, where it is combined with a similar output of a third 90° hybrid coupler 145. Coupler 145 has its input port coupled via RF coupling capacitor 146 to the 90° output port 126 of coupler 122. 90° coupler 145 has its 0° and 90° ports connected respectively to the anodes of PIN diodes 112 and 113. The output port of coupler 145 is coupled via coupling capacitor 150 to the summing network 144.

The PIN diodes 112 and 113 have dc bias applied to each of their anodes via respective low pass filters 151 and 152 which are identical with the filter 132 and 133 described above. The combined fixed positive bias from fixed supply 104 and the cosine control for variable dc bias at terminal 102 combined at junction 108 are applied via the low pass filters 151 and 152 respectively to the diodes 112 and 113. The conduction of the diodes 110 and 111 are both controlled by the sine control potential at terminal 101 while the diodes 112 and 113 conduction levels are controlled by the variable dc potential applied to cosine control terminal 102. Terminals 101 and 102 are independently controllable.

Referring now to the summing network 144 which receives the output of the 90° hybrids 131 and 145, the network 144 includes the summing resistor 160 and an output port 161 through which the combined signals are passed to an output coupling capacitor 162 and a diode 163 to the output terminal 103. The diode 163 is normally biased into a conduction condition by a negative bias supply 164 through a low pass filter 165 to junction 166. During normal operation with a negative bias supplied at terminal 164, the diode 163 is relatively transparent to RF signals appearing at its cathode. When the bias at terminal 164 is removed, the output terminal 103 is isolated from the input terminal 100. The diode 163 is effective to prevent overloading of the receivers connected beyond terminal 103. RF power at the input terminal 100, when diode 163 is in its cutoff condition, is reflected and dissipated largely in the paths to ground via the diodes 110–113 and particularly the terminating resistance 124 at the isolated port of the 90° coupler 122. In normal conducting conditions employing the components described below, the signal controller has approximately an 8 db insertion loss at full power.

The linearizing networks 105 and 106 employed in the bias circuits employ in network 105 a diode 170 and series resistance 171 with a pair of Zener diode resistance shunt branches including Zener diode 172 and resistance 173 shunting the resistor 171 and in turn Zener diode 174 and resistance 175 shunting the resistance 173. Dropping resistances 176 and 180 cooperating with the Zener diodes 172 and 174 to establish reference levels at the junction 107. The anode of diode 170 is connected to the independent sine control terminal 101.

Figure 7:
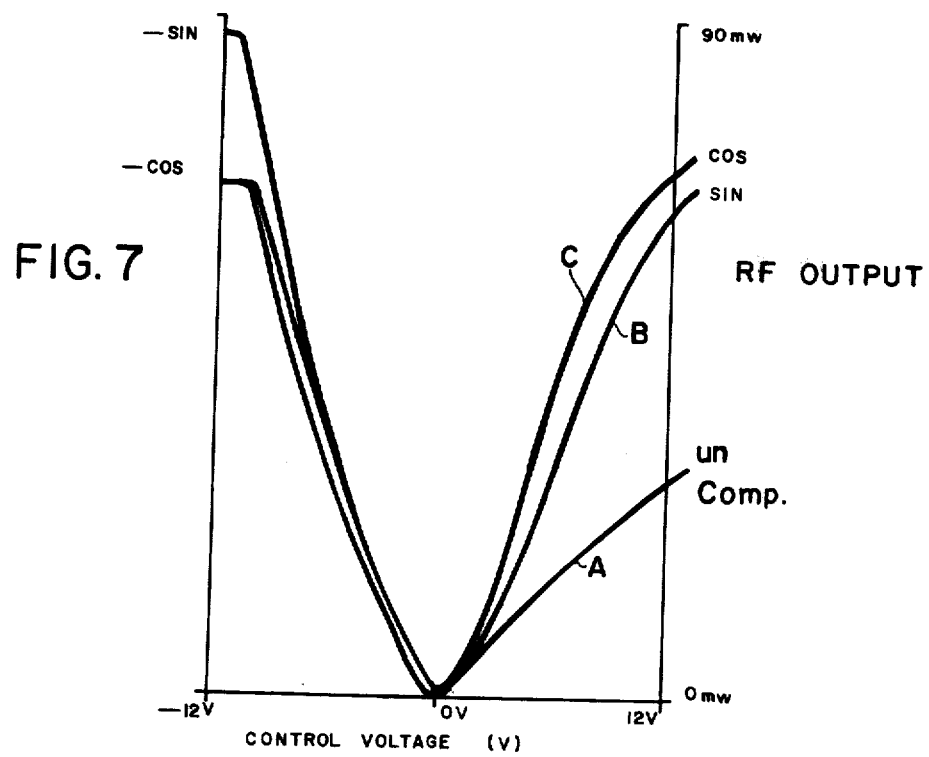
FIG. 7 is a graphical representation of the uncompensated and compensated characteristics of the embodiment of FIG. 6.

The effect of the curve straightening network 105 and its counterpart 106 is apparent by reference to FIG. 7, curve A, which shows the variation in output level at terminal 103 with a varied dc bias applied to terminal 101 in the absence of the network 105. It should be noted that the signal controller responds to both negative and positive levels of the sine control signal, however, the characteristics are definitely nonlinear. A minor degree of 0 offset is present although not significant since linearity is of greater importance in the control circuitry.

Now looking at the curves B and C, the affect of networks 105 and 106 respectively is clearly apparent. Symmetry is improved as well as linearity.

Figure 8:
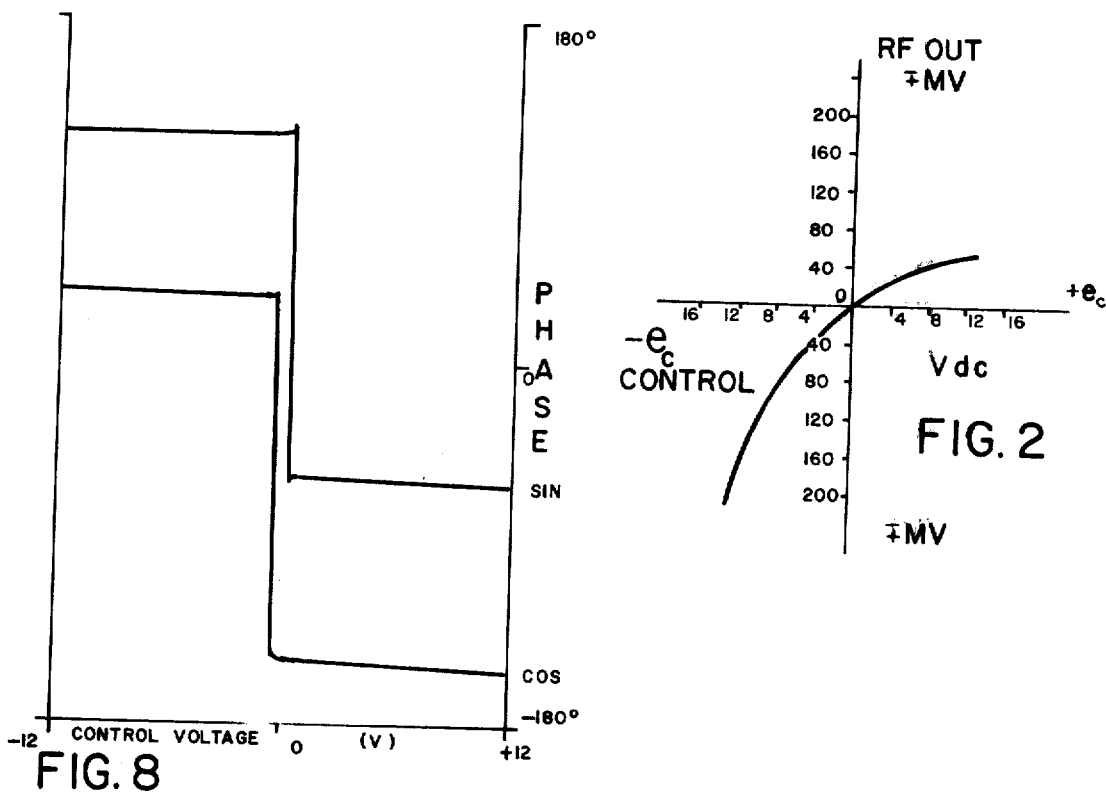
FIG. 8 is a graphical representation of the phase characteristics of the embodiment of FIG. 6.

FIG. 8 illustrates that the control of signals in accordance with this invention does not produce any phase change over the broad range of control from 0 to 12 volts at either the sine or cosine control terminals. Similarly in the 0 to −12v range, the phase shift characteristic is basically flat. The signal controller therefore produces no phase distortion.

In carrying out the invention of FIG. 6, the following components are employed:

Couplers 122, 131, 145: Model H000–312G, Sage Laboratories, Inc., Natuck, Mass.

Directional coupler 120: Model CH–134 Anzac Electronics, Inc., Waltham, Mass.

0° hybrid 122: Model TOHJ 302 hybrid Olektron Corporation, Dudley, Mass.

PIN diodes 110–113: Type UM 4301C Unitrod Corporation, Watertown, Mass.

Xener diodes 172–174: Type 1N750A

Diode 170: 1N456A

The above described embodiments of this invention are merely descriptive of its principles and are not to be considered limiting. The scope of this invention instead shall be determined from the scope of the following claims, including their equivalents.

What is claimed is:

1. A signal controller for continuously varying the amplitude and polarity of an alternating signal comprising:

a first hybrid coupler including an input terminal, a termination terminal, a 0° terminal and a 90° terminal, said input terminal of said first hybrid coupler connectable to a source of alternating signal to be controlled, a second hybrid coupler including an input terminal, a termination terminal, a 0° terminal and a 90° terminal, said input terminal of said second hybrid coupler connected to the 0° terminal of said first hybrid coupler, a third hybrid coupler including an input terminal, a termination terminal, a 0° terminal and a 90° terminal, said input terminal of said third hybrid coupler connected to the 90° terminal of said first hybrid coupler, respective PIN diodes each having one terminal connected to a respective one of the 0° and 90° terminals of said second and third hybrid couplers;

the second terminal of each of said PIN diodes being grounded;

bias means for said PIN diodes;

said bias means comprising static first bias source for establishing the conduction of said PIN diodes for producing a minimum transfer of alternating signal throughout said signal controller, said bias means including continuously controllable and polarity reversible second bias source to provide varying degrees of impedance mismatch of the said controller to said source of alternating signals whereby energy is reflected from said PIN diodes by reason of impedance mismatch thereof to said second and third hybrid couplers, the termination terminals of said second and third hybrid couplers coupled together and constituting the output terminal of said signal controller.

2. The combination in accordance with claim 1 wherein said bias means includes respective static first bias and continuously controllable and polarity reversible second bias source for each PIN diode.

3. The combination in accordance with claim 1 wherein each of said PIN diodes has its cathode grounded.

4. The combination in accordance with claim 1 wherein said termination terminals of said second and third hybrid couplers are coupled together in a 0° coupler and including switch means connectable to said 0° coupler for disabling the output thereof selectively.

5. The combination in accordance with claim 1 wherein said static bias sources include a series of resistance elements having a value selected to bias the respective PIN diode to pass substantially all RF energy to ground when said second bias means is at zero level.

* * * * *